(12) United States Patent
Millyard

(10) Patent No.: US 11,588,444 B2
(45) Date of Patent: Feb. 21, 2023

(54) METHOD AND SYSTEM FOR POWERING AN AUDIO AMPLIFIER

(71) Applicant: Tymphany Acoustic Technology Limited, Taipei (TW)

(72) Inventor: Ruben Minoru Tuemp Millyard, Taipei (TW)

(73) Assignee: TYMPHANY ACOUSTIC TECHNOLOGY LIMITED, Taipei (TW)

( * ) Notice: Subject to any disclaimer, the term of this patent is extended or adjusted under 35 U.S.C. 154(b) by 0 days.

(21) Appl. No.: 17/315,959

(22) Filed: May 10, 2021

(65) Prior Publication Data

US 2021/0376796 A1 Dec. 2, 2021

Related U.S. Application Data

(60) Provisional application No. 63/031,194, filed on May 28, 2020.

(51) Int. Cl.
*H03F 1/02* (2006.01)
*H03F 1/30* (2006.01)
*H03F 1/32* (2006.01)

(52) U.S. Cl.
CPC ............. *H03F 1/0227* (2013.01); *H03F 1/30* (2013.01); *H03F 1/32* (2013.01); *H03F 2200/03* (2013.01)

(58) Field of Classification Search
CPC . H03F 1/0227; H03F 1/30; H03F 1/32; H03F 2200/03; H03F 2200/102; H03F 3/183; H03F 1/304; H04R 29/001; H04R 3/00
USPC .............................. 330/10, 251, 207 A, 297
See application file for complete search history.

(56) References Cited

U.S. PATENT DOCUMENTS

| 10,243,524 | B2 * | 3/2019 | Orr ........................ H03F 1/0227 |
| 10,454,424 | B2 * | 10/2019 | van Dommelen ...... H03F 3/217 |
| 2015/0349737 | A1 | 12/2015 | Svendsen |

* cited by examiner

*Primary Examiner* — Hieu P Nguyen
(74) *Attorney, Agent, or Firm* — Muncy, Geissler, Olds & Lowe, P.C.

(57) ABSTRACT

A method for powering an audio amplifier includes receiving an input audio signal in an audio signal processor, delaying the input audio signal in the audio signal processor to generate a delayed audio signal, predicting a power demand estimate by analyzing the input audio signal to calculate the power demand estimate in the audio signal processer, and selecting, by the audio signal processor, power conversion settings for a DC to DC converter on the basis of the power demand estimate. The method further includes supplying power input to the DC to DC converter, converting the power input in accordance with the power conversion settings to provide a power output, powering the audio amplifier using the power output, and supplying the delayed audio signal to the audio amplifier from the audio signal processor to generate an amplified audio signal.

18 Claims, 5 Drawing Sheets

METHOD AND SYSTEM FOR POWERING AN AUDIO AMPLIFIER

CROSS REFERENCE TO RELATED APPLICATIONS

The present application claims priority to U.S. Provisional Application No. 63/031,194, which was filed on May 28, 2020, the entire contents of which are hereby incorporated by reference.

FIELD OF THE INVENTION

The present invention relates to method and a system for powering an audio amplifier. The invention further relates to a loudspeaker system based on an audio amplifier system.

BACKGROUND OF THE INVENTION

Powering an audio amplifier through a power converter often results in high peak current demands of the power converter due to the high crest factor of typical audio signals. This is particularly problematic in current-limited systems which, consequently, may have severely limited audio power output or significant audio distortion.

Further, due to the current demand of audio signals, power converters are not necessarily operated at their maximum power efficiency, which is often below their maximum current and voltage output.

Furthermore, the high crest factor of audio signals causes relatively high resistive losses since these losses depend on the square of the current.

US patent application publication no. US2015/0349737 teaches boosting a voltage level of a battery to a boost voltage level across a boost capacitor at an output of a boost stage without exceeding a preselected input current limit, the boost voltage level being higher than the voltage level of the battery and higher than a supply voltage required for the audio amplifier to output a predefined maximum peak power into a load.

SUMMARY OF THE INVENTION

The inventors have identified the above-mentioned problems and challenges related to audio amplifiers, and subsequently made the below-described invention which may increase efficiency and audio power of audio amplifier systems.

The invention relates to a method for powering an audio amplifier comprising the steps of receiving an input audio signal in an audio signal processor, delaying said input audio signal in said audio signal processor to generate a delayed audio signal, predicting a power demand estimate by analysing said input audio signal to calculate said power demand estimate in said audio signal processer, selecting, by said audio signal processor, power conversion settings for a DC to DC converter on the basis of said power demand estimate, supplying power input to said DC to DC converter, converting said power input in accordance with said power conversion settings to provide a power output, powering said audio amplifier using said power output, and supplying said delayed audio signal to said audio amplifier from said audio signal processor to generate an amplified audio signal.

In an exemplary embodiment of the invention, the audio signal processer is a digital signal processor, which receives an input audio signal. This signal is analyzed within an analysis time window of 10 milliseconds by integration of its squared amplitude divided by the impedance within this analysis time window to predict a power demand estimate. Based on this, power conversion settings of a DC to DC converter are selected by selecting an output voltage and a maximum output current of the DC to DC converter. In this embodiment, the DC to DC converter is a switch-mode boost converter powered by a current-limited battery and it receives input from the audio signal processor where the input is indicative of the selected power conversion settings, such that the DC to DC converter is operated at the corresponding output voltage and max output current. In the audio signal processer, the input audio signal is delayed by 10 milliseconds to generate a delayed audio signal. The delayed audio signal is supplied to an audio amplifier, which is powered by the output of the DC to DC converter and which generates an amplified audio signal. When the input audio signal comprises a large peak, the calculated power demand increases, and consequently, so does the output voltage of the DC to DC converter. As a result, energy is stored in at least one capacitor associated with the DC to DC converter. When the peak reaches the audio amplifier as a delayed audio signal, the stored energy is used by the audio amplifier to properly amplify the peak and generate an amplified audio signal with minimal distortion while maintaining a fixed or limited input current.

By dynamically predicting a power demand estimate and selecting power conversion settings according to embodiments of the invention, the DC to DC converter may be operated at an optimal efficiency as much as possible, without compromising sound quality, which is advantageous to the overall system efficiency.

Furthermore, delaying the audio signal allows improved averaging of peak current demands, particularly in embodiments of the invention in which the DC to DC converter is associated with an energy storage. This allows minimizing power consumption since power dissipated in a resistive circuit is proportional to the square of the current $P=IV=I^2R$ and consequently, a smoothing of the input current reduces power consumption. By dynamically predicting a power demand estimate and selecting power conversion settings, peak currents, e.g., peak current demand of the DC to DC converter, may be reduced and, accordingly, power consumption can be minimized without compromising sound quality, which is advantageous.

An objective of embodiments of the invention is thus to reduce the crest factor of an input current to the DC to DC converter to reduce power consumption.

Generally, reducing power consumption is advantageous for any type of device, but it is particularly useful for current-limited devices, for example devices powered by a current-limited battery, through a USB connection, or through an ethernet connection. In such devices, the invention may be utilized to increase the audio power output, which extends the range of applications of such devices, which is advantageous. Furthermore, in battery-powered devices, the invention can be used to extend the battery lifetime, which is advantageous.

In comparison with previous implementations of audio signal tracking boost converters with adjustable voltage output that responds to the peak audio voltage audio amplifier systems, the invention allows operating a boost converter, e.g., a switch-mode boost converter, at an optimal efficiency. Furthermore, the present invention may avoid unnecessary rapid charging of the energy storage at high currents to further reduce power consumption, as the current limiting control will charge up the energy storage at the minimum current needed to envelope the audio signal within the allowed delay time.

In comparison with tracking the output voltage of an audio amplifier, predicting a power demand reduces the crest factor of the power demand of the DC to DC converter to significantly improve efficiency and audio output power.

An aspect of the invention relates to an audio amplifier system comprising an audio signal processor arranged to receive an input audio signal and supply an output audio signal based on said input audio signal, a DC to DC converter which is powered by a power input and arranged to convert said power input to provide a power output, and an audio amplifier powered by said power output and arranged to amplify said output audio signal to generate an amplified audio signal, characterized in that said audio signal processor comprises an audio signal delay operation arranged to generate said output audio signal by delaying said input audio signal, and an audio signal analysis operation arranged to calculate a power demand estimate based on amplitude of said input audio signal to output a power conversion control output based on said power demand estimate, wherein said DC to DC converter is arranged to receive said power conversion control output and convert said power input according to said power conversion control output to provide said power output.

The output audio signal may thus be understood as a delayed audio signal. The power conversion control output may be understood as a communicative representation of power conversion settings and may thus be indicative of e.g., a DC level or voltage.

In embodiments of the invention, the audio amplifier system is arranged to carry out any of the methods of the present invention. Accordingly, the audio amplifier system may comprise any elements necessary for carrying out any of the methods.

Any audio amplifier system according to the invention may have the same advantages as methods of the present invention.

An aspect of the invention relates to a loudspeaker system comprising a loudspeaker transducer, an audio amplifier system according to the present invention, wherein said amplified audio signal is provided to said loudspeaker transducer to reproduce said amplified audio signal as sound pressure waves.

In embodiments of the invention, the loudspeaker system is arranged to carry out the any of the methods of the present invention. Accordingly, the loudspeaker system may comprise any elements necessary for carrying out any of the methods of the invention.

Any loudspeaker system according to the invention may have the same advantages as methods according to the invention.

BRIEF DESCRIPTION OF THE DRAWINGS

Various embodiments of the invention will in the following be described with reference to the drawings where.

DETAILED DESCRIPTION

Figure 1:
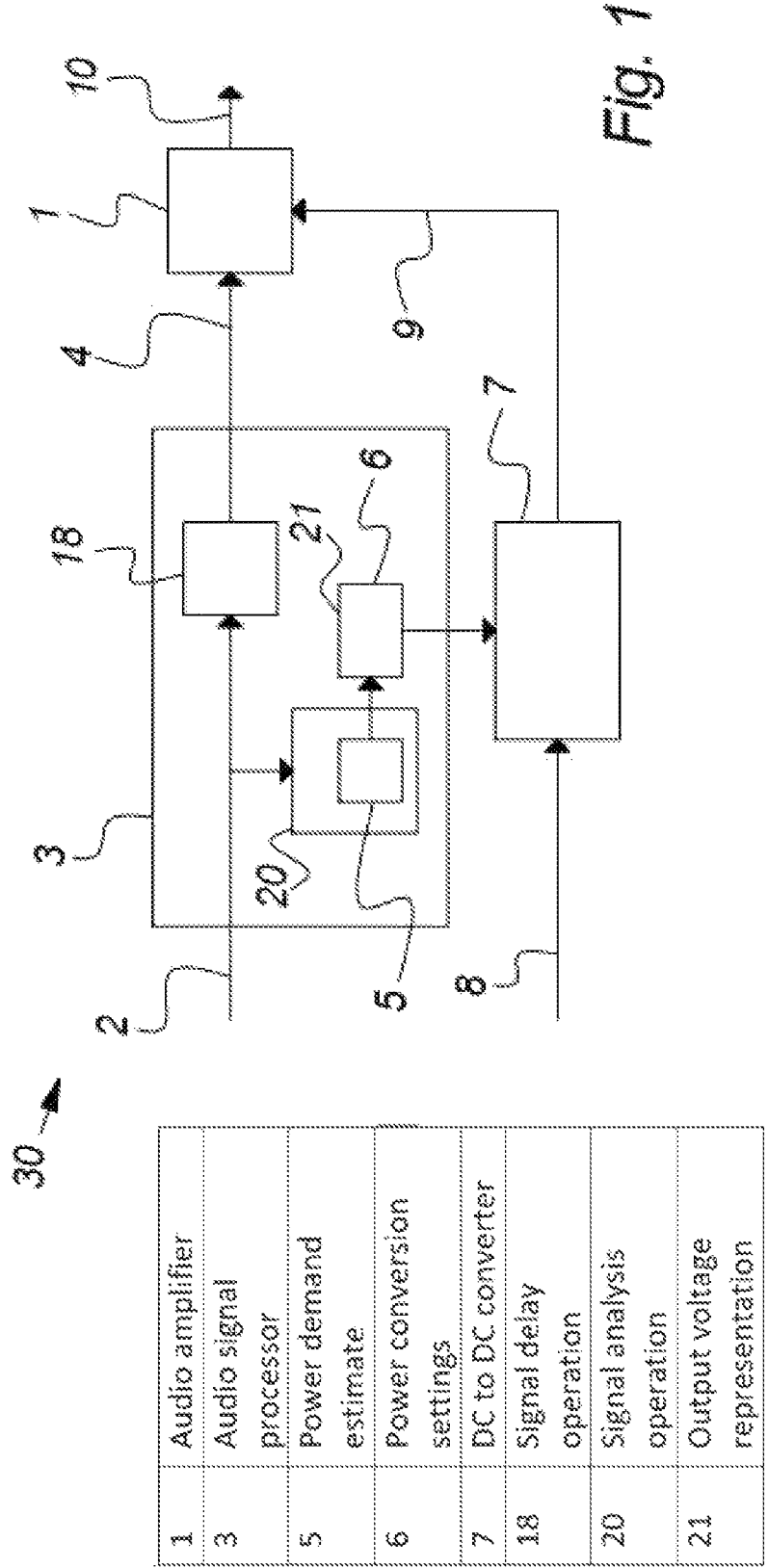
FIG. 1 1 illustrates an exemplary embodiment of the invention.

In the context of the present invention, a power demand estimate may be understood as an outcome of a calculation which is indicative of a power required to amplify the delayed audio signal in the audio amplifier. The power required may be a cumulative power, for example taking into account energy stored in an energy storage. The power demand may for example increase before the power is required by the audio amplifier. The power demand is calculated in an audio signal processor, and accordingly, its calculation may for example be digitally implemented.

Power conversion settings may be understood as representations of one or more controllable output settings or parameters of a DC to DC converter. Power conversion settings may for example be indicative of an output voltage, an output current, a max output voltage, a max output current, and/or a conversion efficiency of the DC to DC converter. For example, in some embodiments of the invention, selecting power conversion settings comprises selecting an output voltage. In some other embodiments of the invention, selecting power conversion settings comprises selecting an output current or a conversion mode. In some other embodiments of the invention, selecting power conversion settings comprises selecting an output voltage and a max output current. However, note that power conversion settings according to the invention is not restricted to these examples.

A DC to DC converter may be understood as an electronic circuit or electromechanical device that converts a source of direct current (DC) from one voltage level to another voltage level. In typical embodiments of the invention, the DC to DC converter is arranged to increase the voltage level while a current level is reduced accordingly. DC to DC converters according to the invention should be, at least partly, controllable, e.g., an output voltage of a DC to DC converter is controllable. In some embodiments of the invention, the DC to DC converter is a switch-mode boost converter, but the invention is not limited to this example, and the DC to DC converter may for example be a SEPIC converter, a Ćuk converter, or a flyback converter.

An audio signal processor according to the invention may typically be a digital signal processor but is not restricted to this example. It may for example be based on an analog circuit to perform the necessary operations.

In embodiments of the invention, various powers, voltages, currents, digital, and/or analogue signals may be communicated within elements and between elements of an embodiment using wired or wireless communication. For example, in an embodiment where the audio signal processor is a digital signal processer, communication performed within the digital signal processer is primarily digital, but it may receive and output analogue signals, e.g., the input audio signal and the delayed audio signal, via analogue-to-digital and digital-to-analogue converters. In another example, the DC to DC converter may input and output power, while being controlled/regulated by an analogue signal provided by the audio signal processor. Thus, powers and signals, and communication of these, are not restricted to any type.

FIG. 1 illustrates an exemplary embodiment of the invention. Here, an audio amplifier 1 is powered by a DC to DC converter 7 which is regulated by an audio signal processer 3. The regulation ensures that sufficient power is provided to the audio amplifier 1 with efficient power conversion and minimal audio distortion.

The audio signal processor 3 is a digital signal processor 3. Here, an input audio signal 2 is delayed by applying an audio signal delay operation 18 to generate a delayed audio signal 4 which is provided to the audio amplifier 1.

The input audio signal 2 is analyzed in an audio signal analysis operation 20 to calculate a power demand estimate 5. In some embodiments, the power demand estimate 5 is calculated based on an amplitude of the input audio signal 2, for example based on a squared amplitude of the signal and for example based on an integration of the squared amplitude of the signal within an analysis time window which matches the delay duration, or some significant fraction of the delay window. System impedance transfer function compensation may also be applied for the signal to represent the impendence of the loudspeaker system when performing the power estimate calculation.

Based on the power demand estimate 5, power conversion settings 6 for the DC to DC converter 7 is selected. In the illustrated embodiment, the power conversion settings 6 are related to an output voltage of a power output 9 of the DC to DC converter 7, such that if the power conversion settings 6 change, so does the output voltage. The DC to DC converter 7 receives a power input 8, which it converts to the power output 9 according to the power conversion settings 6.

The power output 9 is provided to the audio amplifier 1 to power it. The audio amplifier 1 further receives the delayed audio signal 4, which it is arranged to amplify using the power output 9. In this exemplary embodiment, the delay on the delayed audio signal 4 ensures that the analysis in the audio signal processor 3 can be performed and that the output voltage can be regulated, such that any delayed output signal 4 sent to the audio amplifier 1 can be amplified accordingly using the regulated output voltage to yield an amplified audio signal 10.

In some embodiments of the invention, the delay, which is applied to the input audio signal 2 to generate the delayed audio signal 4, further allows the DC to DC converter 7 to store energy, prior to usage of this energy by the audio amplifier 1. For example, if an input audio signal 2 comprises a signal peak with a large amplitude, the delay ensures that an energy storage can be charged prior to the arrival of the signal peak at the audio amplifier 1. When the signal peak reaches the audio amplifier 1 in the delayed audio signal 4, the energy stored can be utilized by the audio amplifier 1 for amplification of the delayed audio signal 4. A properly timed and regulated energy storage can ensure a reduction of amplitude of peak current demand of the power input 8, as the controller will only select the minimum peak current needed to reach a voltage on the output capacitors that can meet both the peak voltage and peak power demand on the upcoming audio waveform.

Due to the audio signal delay operation 18, the prediction of a power demand estimate 5, and the selection of power conversion settings 6, it is possible to operate the DC to DC converter 7 at optimal settings with respect to conversion efficiency. Storage of energy allows peak current demand of the power input 8 to be reduced which further increases effectivity of the system and increases the audio power output.

Figure 2:
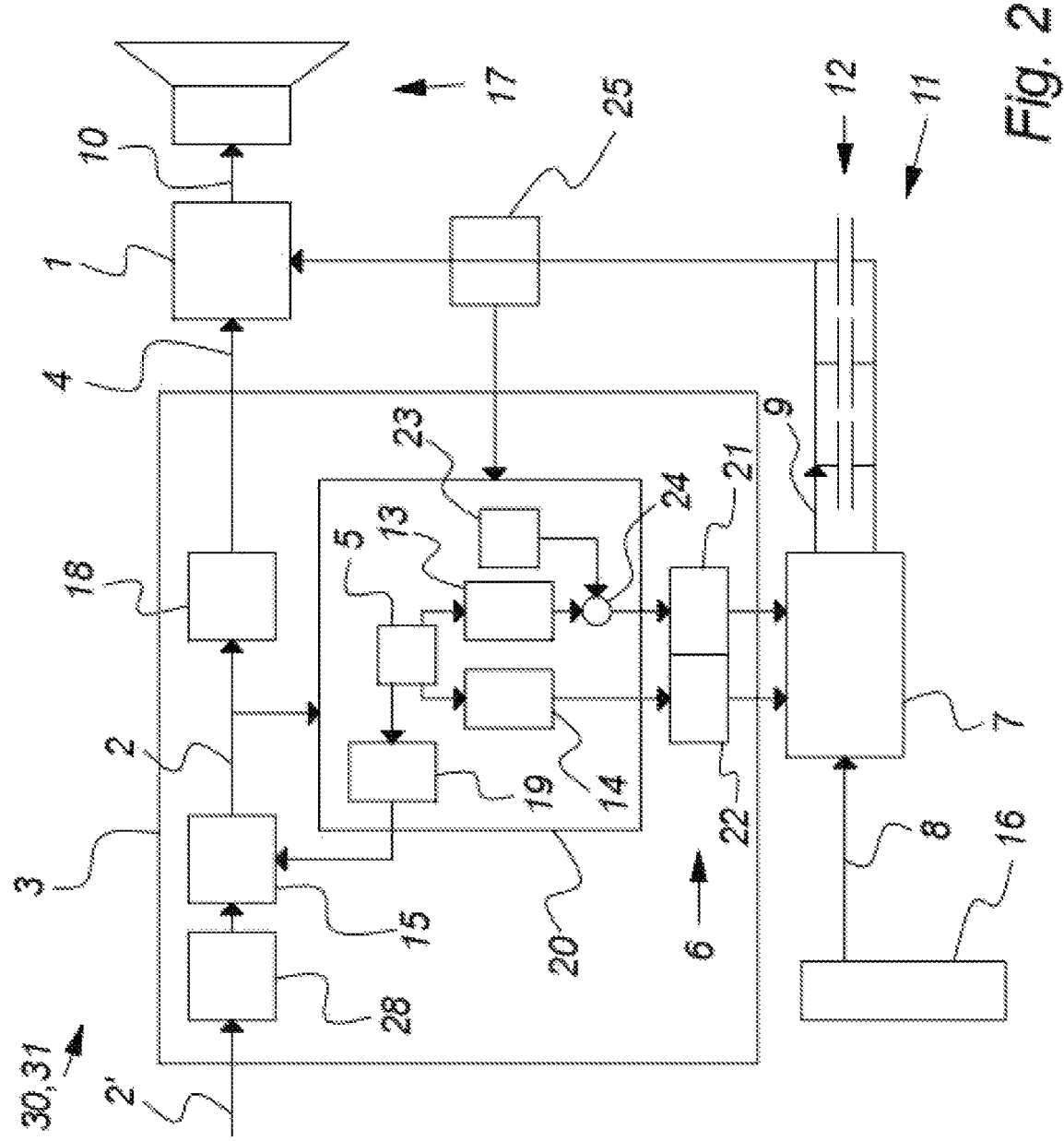
FIG. 2 illustrates another embodiment of the invention.

FIG. 2 illustrates another embodiment of the invention. In comparison with the embodiment of the invention as illustrated in FIG. 1, the embodiment of the invention as illustrated in FIG. 2 features a number of additional elements.

The input audio signal 2' is initially filtered in an equalization filter 28 prior to dynamic range compression 15. The equalization filter 28 may for example be applied to compensate for a transfer function, such as a transfer function of the loudspeaker transducer 17 and/or an acoustical environment of the system. It may be pre-programmed onto the audio signal processor 3 and/or adjustable by a user of the system.

The dynamic range compression 15 is at least partially controlled by the audio signal analysis operation 20 wherein a power demand estimate is predicted through a calculation. In this embodiment, the dynamic range compression 15 is regulated through a dynamic range compression transfer function 19, for example based on a look-up table. The transfer function 19 translates a calculated power demand estimate 5 to an upper compression amplitude threshold of the dynamic range compression 15. The amplitude of the input audio signal 2' which is greater than this threshold is reduced. In this way, the dynamic range compression 15 is regulated to minimize distortion of the delayed audio signal 4 upon amplification due to insufficient power provided to the audio amplifier 1, which may for example occur upon audio signals with a long duration of large amplitude.

Due to the equalization filter 28 and the dynamic range compression 15, the input audio signal 2' initially provided to the audio signal processor 3 and the input audio signal 2 used for the prediction of the power demand estimate 5 are not necessarily identical. However, the term "input audio signal" may be used to refer to any of these input audio signals 2, 2'.

The input audio signal 2 is delayed in an audio signal delay operation 18 to generate a delayed audio signal 4.

Within the audio signal analysis operation 20, a power demand estimate 5 is predicted through a calculation. The calculated power demand estimate 5 serves as basis for selecting power conversion settings for the DC to DC converter 7, as well as for the previously described dynamic range compression. The audio signal analysis operation 20 is based on the input audio signal 2, and a part of the input audio signal 2 which lies within an analysis time window is used for the analysis. The duration of the analysis time window is similar to the duration with which the input audio signal 2 is delayed in the audio signal delay operation 18 to generate the delayed audio signal 4. The squared amplitude of the input audio signal is integrated within the analysis time window to calculate the power demand estimate 5. In various embodiments of the invention, the integration is performed in the time domain and/or in the frequency domain. The calculation may further take into account an amplifier transfer function and/or a transducer impedance transfer function. It may even further utilize external sensor inputs or models and/or measurement of the system components temperatures to improve the accuracy of the power prediction.

In the illustrated embodiment, the audio signal analysis operation 20 further receives input from an amplifier power usage measurement 25, and the power demand estimate 5 can rely on this measurement 25. For example, the power demand estimate 5 is calculated based on one or more prediction coefficients indicative of power demand of the audio amplifier 1. A prediction coefficient may for example be a pre-factor or an offset in an integration of the input audio signal 2. The amplifier power usage measurement 25 may then be used to update any prediction coefficients to ensure an accurate and precise power demand estimate 5.

In other embodiments of the invention, an amplifier power usage measurement 25 is used to select power conversion settings 6, e.g., the power demand estimate 5 is not based on the amplifier power usage measurement 25, however a voltage transfer function 13 and/or a current transfer function 14 are/is.

When a power demand estimate 5 has been calculated, it is used as input for a voltage transfer function 13, a current transfer function 14, and a dynamic range compression transfer function 19. In the voltage transfer function 13, a tentative output voltage is established based on the power demand estimate 5. In the current transfer function 14, a max output current is established. And similarly, in the dynamic range compression transfer function 19, an upper compression amplitude threshold of the dynamic range compression 15 is established. Each of these transfer functions 13,14,19 may for example be based on individual look-up tables or mathematical functions, such that a certain value of the power demand estimate 5 is translated to a certain output of each transfer function 13,14,19.

Based on the output of the voltage transfer function 13 and the current transfer function 14, the power conversion settings 6 are thus established, wherein the power conversion settings 6 comprise an output voltage representation 21 and a max output current representation 22 which is communicated to the DC to DC converter 7 to regulate and control it.

The output voltage and its representation 21 is based on output of the voltage transfer function 13, i.e. the tentative output voltage, and further, it is based on peak detection analysis 23. In peak detection analysis 23, the input audio signal 2 is analysed to detect the presence of any peak with an amplitude greater than a peak amplitude threshold within the analysis time window. The peak detection analysis 23 provides an output which is added to the tentative output voltage in an addition operation 24. Upon detection of an audio signal peak with an amplitude greater than the threshold, a peak voltage offset supplied by the peak detection analysis is added to the tentative output voltage to generate the output voltage. If no such peak is within the analysis time window, no peak voltage offset is added, and the output voltage is equal to the tentative output voltage.

The power conversion settings 6, i.e., the output voltage representation 21 and the max output current representation 22 are supplied to the DC to DC converter 7 to regulate it. In this embodiment, the DC to DC converter receives a power input 8 provided by a battery 16 but note that other power sources may be used according to other embodiments of the invention. The DC to DC converter converts the power input 8 into a power output 9. For example, the DC to DC converter 7 is based on a switch-mode boost converter which increases the voltage of the power input 8 to generate the power output 9. Consequently, the current of the power output 9 is typically correspondingly lower than the current of the power input 8. A switch-mode boost converter may typically be regulated by changing the duration in which a switch is open and/or closed, e.g. by changing a duty cycle.

The DC to DC converter 7 may further comprise filters, e.g. made of capacitors to reduce noise such as voltage ripples. The DC to DC converter 7 may further comprise stabilization such as a PID controller (proportional-integral-derivative controller) which ensures a stable power output of the DC to DC converter 7.

A DC to DC converter 7, such as a switch-mode boost converter, may have a built-in energy storage, e.g. a capacitor, which is necessary for operation of the DC to DC converter 7. In the embodiment illustrated in FIG. 2, the DC to DC converter 7 is further connected to an energy storage 11 based on auxiliary capacitors 12. This energy storage 11 may be used to store energy of the power output 9 when this output is greater than the power demand of the audio amplifier 1.

The audio amplifier 1 receives power from the DC to DC converter 7 and the energy storage 11 to amplify the delayed audio signal 4 into an amplified audio signal 10. The amplified audio signal 10 is supplied to a loudspeaker transducer 17 which reproduces the amplified audio signal 10 as sound pressure waves.

Due to the audio signal delay operation 18, the prediction of a power demand estimate 5, and the selection of power conversion settings 6, it is possible to operate the DC to DC converter 7 at optimal settings with respect to conversion efficiency. Storage of energy allows peak current demand of the power input 8 to be reduced which further increases the efficiency of the system and increases the audio power output.

FIGS. 3*a*-*d* illustrate audio signal processing and energy storing according to an embodiment of the invention. The four figures respectively show an exemplary representation of the input audio signal 2, the delayed audio signal 4, the power demand estimate 5, and stored energy 26. In each figure, a delay duration 27 is shown for comparison. The horizontal direction in each figure is a time axis with progression of time occurring in the direction from left to right.

The curves illustrated in FIGS. 3*a*-*d* are indicative of how signal processing and energy storage occurs in some embodiments of the invention. For example, how signal processing and energy storage may occur in for example the embodiment as illustrated in FIG. 2.

Figure 3A:
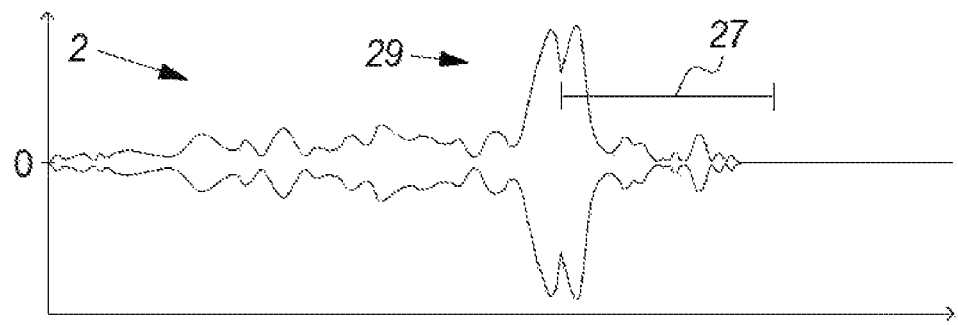
FIGS. 3a-d illustrate audio signal processing and energy storing according to an embodiment of the invention.

FIG. 3*a* illustrates an exemplary input audio signal 2 of an audio amplifier system, such as an envelope of the input audio signal 2. Initially, the amplitude of the input audio signal is relatively low featuring several small peaks of low amplitude. Subsequently, a localized audio signal peak structure 29 is present, followed by low amplitude peaks.

Figure 3B:
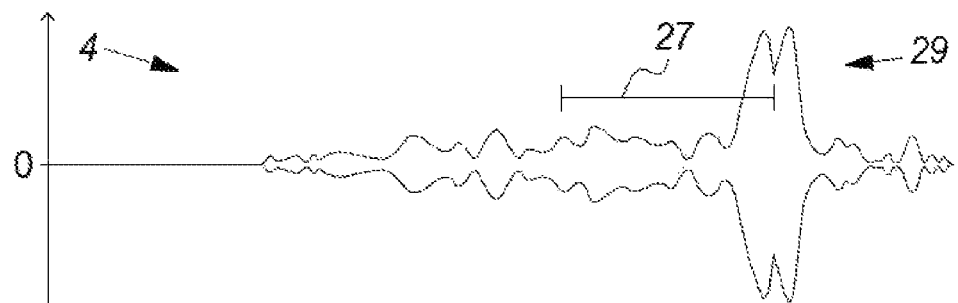

FIG. 3*b* illustrates an exemplary delayed audio signal 4, such as an envelope of a delayed audio signal 4, based on the input audio signal illustrated in FIG. 3*a*. The delayed audio signal 4 is shifted in time corresponding to the delay duration 27, which is shown for comparison. As such, the delayed audio signal 4 is substantially similar to the input audio signal 2 and thus features a similar audio signal peak structure 29 but it is delayed in time.

Figure 3C:
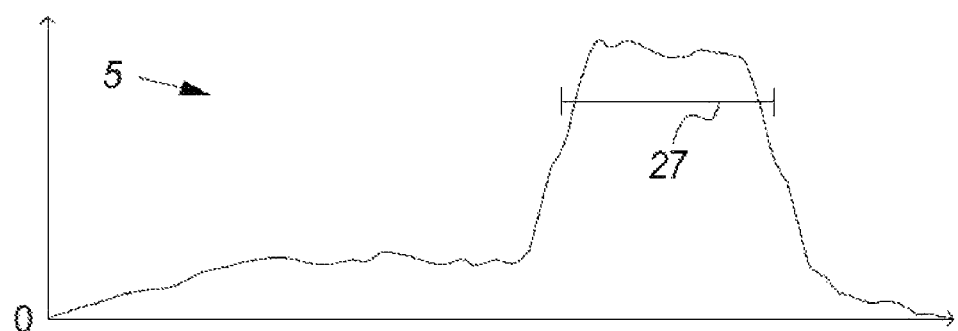

FIG. 3*c* illustrates an exemplary power demand estimate 5 based on the input audio signal 2 with increasing power demand estimate in the direction the vertical arrow on FIG. 3*c*. Each point in the power demand curve 5 is generated based on an integration of the input audio signal 2 in an analysis time window which extends backwards in time and which has an extent identical to the shown delay duration 27. Consequently, as the amplitude of the input audio signal 2 increases, so does the power demand estimate 5, and when the amplitude of the input audio signal 2 decreases, so does the power demand estimate, but with a delay corresponding to the delay duration 27. Consequently, the illustrated power demand estimate 5 initially grows relatively slowly. Then, at the time of the audio signal peak structure 29 of the input audio signal 2, the power demand estimate 5 increases significantly, followed by a decrease at the time of the audio signal peak structure 29 of the delayed audio signal 4. The resulting power demand estimate 5 has a top hat-like shape, with a shape determined by the duration of the analysis time window and the audio signal peak structure 29.

Figure 3D:
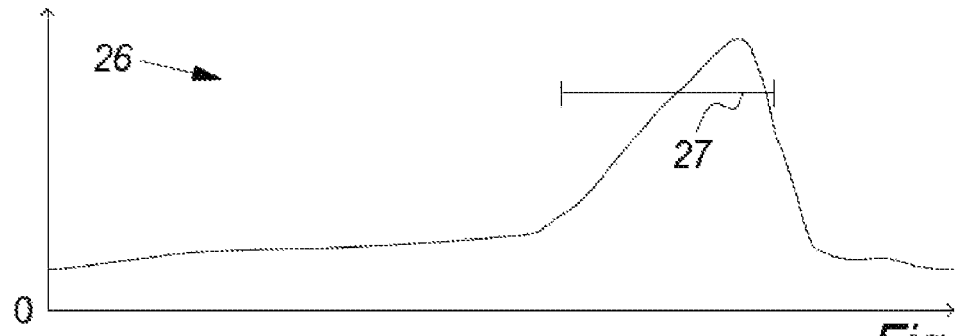

FIG. 3*d* illustrates an exemplary progress of stored energy 26 based on the delayed audio signal 4 and the power demand estimate 5 with increased stored energy in the direction of the vertical arrow on FIG. 3*d*. The power demand estimate 5 determines the power output 9 of the DC to DC converter 7. This power output is supplied to an audio amplifier and an energy storage. The audio amplifier receives the delayed audio signal and use power accordingly. When the DC to DC amplifier supplies more power than used by the audio amplifier, the energy is stored in the energy storage (see for example the energy storage 11 in FIG. 2). When the DC to DC amplifier supplies less power than used by the audio amplifier, the audio amplifier is at least partially powered by energy stored in the energy storage. Thus, the amplitude of the power demand estimate 5 increases the stored energy 26, while the amplitude of the delayed audio signal 4 decreases the stored energy 26. In FIG. 3*d*, the stored energy is therefore initially relatively flat. When the power demand increases near the audio signal peak structure 29 of the input audio signal 2, the stored energy 26 starts to gradually increase as well. While the delayed audio signal 4 has a small amplitude, the stored energy 26 continues to grow. At the time of the audio signal peak structure 29 of the delayed audio signal 4, the stored energy 26 quickly decreases. In the example shown here, the audio amplifier requires more energy than provided by the DC to DC converter alone, and thus the stored energy 26 is used as well. Note that after the audio signal peak structure 29 of the delayed audio signal 4, the stored energy is low again. Thus, the power demand estimate was relatively accurate considering the actual power demand and consequently an adequate amount of energy was stored prior to the amplification of the audio signal peak structure 29.

The curves illustrated in FIGS. 3*a-d* illustrate delaying an input audio signal 4, calculating a power demand estimate 5, and how energy 26 is stored and dispersed in an energy storage according to embodiments of the invention. Note that the curves and their shapes are illustrative examples and should not be viewed as limitations of the present invention. Signal processing and energy storage may thus be varied in a multitude of ways within the scope of the invention as specified in the claims.

Figure 4A:
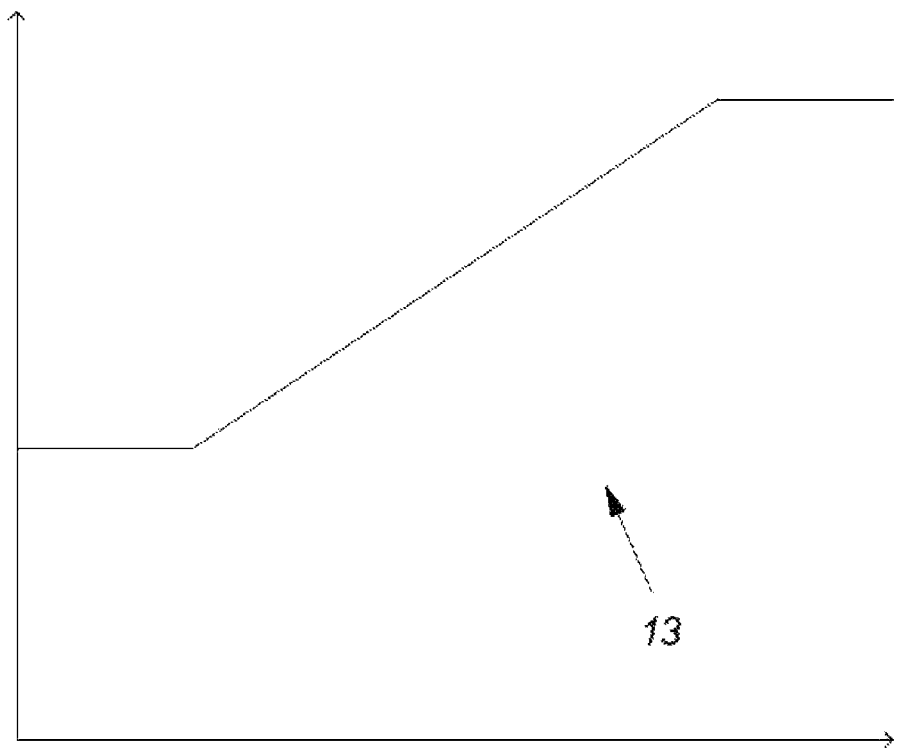
FIGS. 4a-b illustrate representations of an exemplary voltage transfer function and an exemplary current transfer function according to an embodiment of the invention.
Figure 4B:
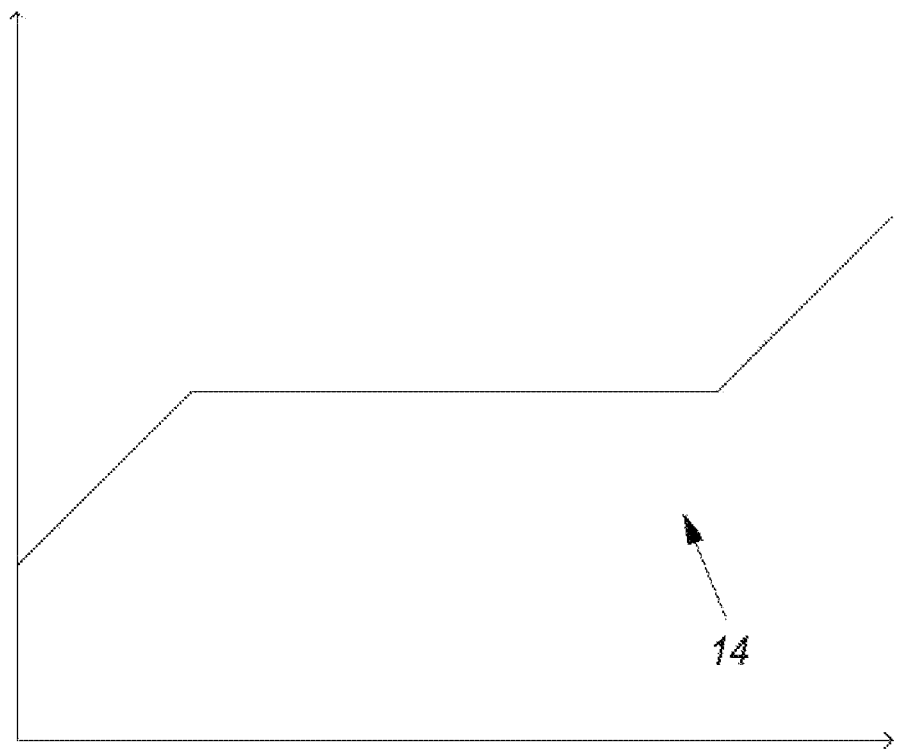

FIGS. 4*a-b* illustrate representations of an exemplary voltage transfer function 13 and an exemplary current transfer function 14 according to an embodiment of the invention.

The curves 13,14 illustrated in FIGS. 4*a-b* are indicative of how signal processing occurs in some embodiments of the invention. For example, how signal processing may occur in the embodiment of the invention as illustrated in FIG. 2.

The horizontal direction on both figures correspond to an axis representing input power demand estimate with increasing input power demand estimate in the direction along the horizontal arrow. In FIG. 4*a*, the vertical direction is an axis representing output voltage of the DC to DC converter with increasing output voltage in the direction of the vertical arrow, and in FIG. 4*b*, the vertical direction is an axis representing a max output current of the DC to DC converter with increasing output current in the direction of the vertical arrow.

According to some embodiments of the invention, when a power demand estimate 5 has been calculated, the selection of power conversion settings 6 comprises selecting an output voltage and/or a max output current through a voltage transfer function 13 and a current transfer function 14, respectively. For example, a power demand estimate 5 may correspond to a point on the vertical axes in FIGS. 4*a-b*, upon which a corresponding output voltage and a corresponding max output current is selected.

In the illustrated exemplary voltage transfer function 13 and the exemplary current transfer function 14 of FIGS. 4*a* and 4*b* respectively, the shapes of the two transfer functions complement each other, such that an increase in power demand estimate will always result in an increase of either output voltage or max output current. The shapes of the transfer functions 13,14 ensure that the DC to DC converter is operated at an optimal max current in a broad range of power demand estimates. Furthermore, the shapes of the transfer functions 13,14 ensure that the output voltage is never below a minimum value.

According to some embodiments of the invention, the transfer functions 13,14 are based on look-up tables. According to some other embodiments of the invention, the transfer functions 13,14 are based on mathematical functions, e.g., piecewise linear functions.

The curves of FIGS. 4*a-b* and their shapes are illustrative examples and should not be viewed as limitations of the present invention. Signal processing may thus be varied in a multitude of ways within the scope of the invention as specified in the claims.

Figure 5:
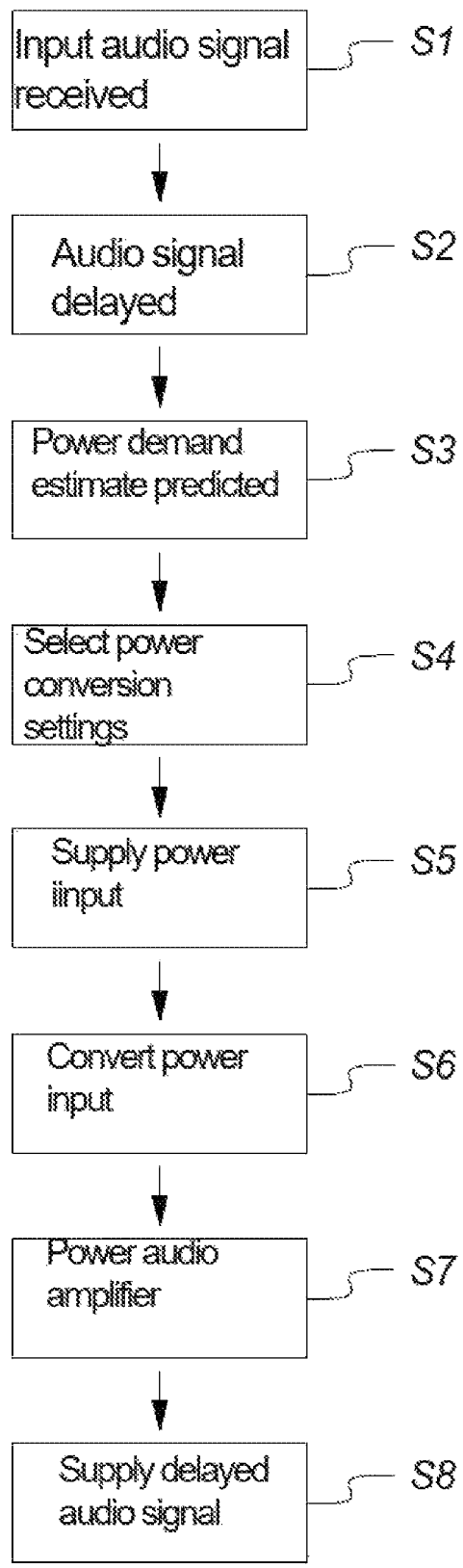
FIG. 5 illustrates a method according to an embodiment of the invention.

FIG. 5 illustrates a method according to an embodiment of the invention. The method comprises eight method steps S1-S8.

In a first step S1 of the method, an input audio signal is received in an audio signal processor.

In a next step S2 of the method, the audio signal is delayed in the audio signal processor to generate a delayed audio signal.

In a next step S3 of the method, a power demand estimate is predicted. This prediction is performed in the audio signal processor by analysing the input audio signal to calculate the power demand estimate.

In a next step S4 of the method, power conversion settings for a DC to DC converter is selected by the audio signal processor based on the power demand estimate. The power conversion settings may for example be indicative of an output voltage of the DC to DC converter.

In a next step S5 of the method, power input is supplied to the DC to DC converter, i.e. the DC to DC converter is powered by the power input.

In a next step S6 of the method, the power input is converted to a power output in accordance with the power conversion settings.

In a next step S7 of the method, an audio amplifier is powered using the power output.

In a next step S8 of the method, the delayed audio signal is supplied to the audio amplifier from the audio signal processor to generate an amplified audio signal. The amplification is based on power of the power output.

Note that the invention is not limited to a particular sequence of steps.

In the following, various embodiments of the present invention are presented without reference to particular figures:

In an embodiment of the invention, the method of the invention comprises a step of charging an energy storage using said power output, wherein said energy storage is arranged to store energy of said power output and disperse energy to said audio amplifier, wherein said step of powering said audio amplifier comprises using power dispersed by said energy storage.

In typical embodiments, an energy storage is arranged to store any surplus power that the DC to DC converter supplies which is not used by the audio amplifier, and similarly, the energy storage provides power to the audio amplifier when the DC to DC converter does not supply enough power itself. As such, the energy storage may be used to facilitate smoothing of current demand, which is advantageous, since it may reduce power consumption and increase audio power output.

In some embodiments, the energy storage is integrated in the DC to DC converter, for example by incorporation of one or more capacitors in a switch-mode boost converter.

In an embodiment of the invention, said energy storage is based on one or more auxiliary capacitors associated with said DC to DC converter.

Capacitors are suitable as an energy storage of the invention, since capacitors can facilitate rapidly alternating storage and dispersion of electrical energy, as required by typical embodiments of the invention.

In an embodiment of the invention, said step of delaying said input audio signal comprises delaying said input audio signal by a delay duration, wherein said delay duration is in the range from 1 millisecond to 100 milliseconds, such as from 2 milliseconds to 50 milliseconds, such as from 5 milliseconds to 20 milliseconds, for example 10 milliseconds.

In an embodiment of the invention, said step of predicting said power demand estimate comprises analysing said input audio signal within an analysis time window, wherein the ratio between the duration of said analysis time window and said delay duration is in the range from 0.1 to 10, such as from 0.2 to 5, such as from 0.5 to 2, for example 1.

In typical embodiments of the invention, the delay duration and the duration of the analysis time window are the same, for example 10 milliseconds or 15 milliseconds. However, these two durations are not restricted to be identical and may for example be 20 milliseconds and 30 milliseconds, respectively.

The durations of the windows should allow the analysis to be performed and the power conversion settings to be implemented for the DC to DC converter.

Furthermore, the durations of the time windows may further allow energy to be stored. For example, such that when a typical audio peak appears in the input audio signal, sufficient energy can be stored in an energy storage within the delay duration to amplify the peak when it reaches the audio amplifier though the delayed audio signal.

In typical embodiments, the analysis time window is continuously updated, such that the duration between two updates of the analysis time window is significantly shorter than the duration of the analysis time window. For example, in an embodiment, the duration of the analysis time window is 5 milliseconds, but it is updated every 0.5 milliseconds, e.g., such that a new power demand estimate is calculated every 0.5 milliseconds.

In an embodiment of the invention, said step of predicting said power demand estimate comprises using an amplitude of said input audio signal to calculate said power demand estimate.

The power consumption of an audio amplifier typically depends on the amplitude of the audio signal to be amplified. Accordingly, it is advantageous to take the amplitude of the audio signal into account when calculating the power demand estimate.

A calculation including the amplitude may for example further include calculating an absolute value of the amplitude, calculating a squared value of the amplitude, finding a peak value of the amplitude, identifying audio signal with amplitude above an amplitude threshold etc.

In an embodiment of the invention, said step of predicting said power demand estimate comprises using an amplifier transfer function to calculate said power demand estimate, wherein said amplifier transfer function is related to said audio amplifier.

The power consumption of an audio amplifier may depend on e.g. the frequency of the audio signal. Accordingly, it is advantageous to take the properties of the audio amplifier into account, e.g., through an amplifier transfer function used to calculate the power demand estimate.

In an embodiment of the invention, said step of predicting said power demand estimate comprises using a transducer impedance transfer function to calculate said power demand estimate, wherein said transducer impedance transfer function is indicative of an impedance of a loudspeaker transducer receiving said amplified audio signal.

The capability of a loudspeaker transducer to convert electrical power into acoustical power may typically be frequency dependent. This conversion efficiency of the loudspeaker transducer will affect the power used by the amplifier. Therefore, it is advantageous to include a transducer impedance transfer function when calculating the power demand estimate.

In an embodiment of the invention, said step of predicting said power demand estimate comprises integrating a representation of said amplitude of said input audio signal within said analysis time window to calculate said power demand estimate.

Performing an integration is advantageous since this allows the shape of the input audio signal, e.g., the width of an audio signal peak, to be taken into account, which is advantageous to accurately power the audio amplifier.

In an embodiment of the invention, said step of predicting said power demand estimate comprises calculating said power demand estimate by the formula $$PDE = \int TITF \times IAS^2 dx$$

wherein PDE is said power demand estimate, TITF is said transducer impedance transfer function, IAS is said input audio signal, and the integration is performed based on said input audio signal within said analysis time window.

In some embodiments of the invention, the power demand estimate is calculated in time space, i.e., the integration variable dx is indicative of time. In some other embodiments of the invention, the power demand estimate is calculated in frequency space, i.e., the integration variable dx is indicative of frequency. For example, a fast Fourier transformation (FFT) is applied to the input audio signal within an analysis time window, and the integration is performed using on this frequency representation of the audio signal by multiplying the FFT by transducer impendence and integrating the total power from all frequency bins.

Calculating the power demand estimate by using the above formula is advantageous since the square of the input audio signal is indicative of the actual power required for amplification. Furthermore, the system impedance transfer function is taken into account.

In an embodiment of the invention, said step of selecting said power conversion settings comprises changing first power conversion settings to second power conversion settings, wherein said first power conversion settings are associated with a first conversion efficiency of said DC to DC converter and said second power conversion settings are associated with a second conversion efficiency of said DC to DC converter, wherein said second conversion efficiency is greater than said first conversion efficiency.

Conversion efficiency may be understood as a power efficiency with which the DC to DC converter converts the power input to the power output.

Changing from first power conversion settings to second power conversion settings to improve conversion efficiency of power input to power output is advantageous since it reduces power consumption of the DC to DC converter.

In an embodiment of the invention, said step of selecting said power conversion settings comprises selecting an output voltage of said power output using a voltage transfer function, wherein said voltage transfer function is based on said power demand estimate.

Selecting an output voltage of the DC to DC converter is advantageous, since controlling the output voltage is a straightforward way of controlling the power consumption of the DC to DC controller and associated storage of energy for the audio amplifier. A voltage transfer function which receives the power demand estimate as an input is a flexible and simple facilitation of selecting an output voltage.

In an embodiment of the invention, said voltage transfer function is based on a voltage look-up table.

In an embodiment of the invention, said voltage transfer function is based on a mathematical function.

A voltage look-up table is a flexible and simple type of voltage transfer function, which is easy to implement, e.g., in a digital signal processor. A voltage look-up table according to the invention is not restricted to any particular shape or type, and may for example resemble a mathematical function, a piecewise function, or reflect an optimal efficiency of the DC to DC converter.

In an embodiment of the invention, said selecting said output voltage is based on a peak amplitude of said input audio signal.

Selecting the output voltage based on a peak amplitude of the input audio signal may be in combination with a calculated power demand estimate. For example, in an embodiment of the invention, a power demand estimate is calculated through integration of the input audio signal within an analysis time window, upon which a tentative output voltage is established. Furthermore, peak detection analysis is performed wherein the input audio signal is analysed to detect the presence of any audio peaks with a peak amplitude above a peak amplitude threshold within the analysis time window. Upon detection of such a peak, a peak voltage offset is added to the tentative output voltage to generate the output voltage. If no audio peaks have an amplitude above the peak amplitude threshold, the tentative output voltage is the output voltage. Accordingly, the method of this embodiment is able to detect peaks and change the output voltage of the DC to DC converter accordingly.

Selecting the output voltage based on a peak amplitude of the input audio signal as exemplified above is advantageous, since it allows for a more accurate and precise output voltage to be selected, which both ensures a high efficiency of the DC to DC converter, while ensuring accurate amplification of the delayed audio signal.

In an embodiment of the invention, said step of selecting said power conversion settings comprises selecting a max output current of said power output using a current transfer function, wherein said current transfer function is based on said power demand estimate.

Some DC to DC converters are associated with a controllable max output current of their power output. This max output current may for example be related to the power efficiency of power conversion. Therefore, it is advantageous to actively select the max output current to increase efficiency while ensuring that sufficient current is available for the audio amplifier and/or the energy storage. A current transfer function which receives the power demand estimate as an input is a flexible and simple facilitation of selecting a max output current.

In an embodiment of the invention, said current transfer function is based on a current look-up table.

In an embodiment of the invention, said current transfer function is based on a mathematical function.

A current look-up table is a flexible and simple type of current transfer function, which is easy to implement, e.g., in a digital signal processor. A current look-up table according to the invention is not restricted to any particular shape or type, and may for example resemble a mathematical function, a piecewise function, or reflect an optimal efficiency of the DC to DC converter.

Generally, a voltage transfer function and a current transfer function should individually or in combination ensure that the power output delivered by the DC to DC converter is sufficient to power the audio amplifier, for example in combination with an associated energy storage.

In an embodiment of the invention, the method of the invention comprises a step of applying an equalization filter to said input audio signal prior to said predicting said power demand estimate.

Applying an equalization filter is advantageous since it permits altering the input audio signal to a frequency response of an audio amplifier system, for example to adapt it to a certain application. The equalization filter should preferably be applied prior to predicting the power demand estimate, since the prediction should rely on the filtered input audio signal to calculate an accurate and precise power demand estimate.

The equalization filter may typically be based on strengthening or weakening energy of specific frequency ranges of the input audio signal.

In an embodiment of the invention, the method of the invention comprises a step of applying dynamic range compression to any of said input audio signal and said delayed audio signal in said audio signal processor, wherein said dynamic range compression is based on said power demand estimate.

Some embodiments of the invention may have a limited capacity to store energy for the audio amplifier or a limited audio amplification range. In some of these embodiments, upon arrival of a lengthy audio signal with large amplitude, a dynamic range compression of the audio signal reduces the audio distortion which could otherwise occur, which is advantageous.

In embodiments of the invention, the dynamic range compression may either be applied to the input audio signal or the delayed audio signal.

The dynamic range compression (DRC) 15 may for example be implemented through a transfer function, e.g., a look-up table.

If the DRC 15 is implemented before the delay, and the output of the DRC is input to the power estimation, the system can be designed with a power compression feedback loop that can allow the system to regulate the output power to a fixed level. This could be achieved by triggering the DRC 15 to compress the output when the system power prediction is over a specific level and allow the DRC 15 to stop only when the power prediction is below a specific level. This can also be further improved using a full PID controller, or for example just PI, or PD control. This power limiting regulation feature can be extremely useful for achieving highest possible acoustic output for power-limited systems.

Basing the dynamic range compression on the power demand estimate is advantageous, since the power demand estimate is indicative of the power required by the audio amplifier, which in turn is indicative of whether sufficient power is available for the audio amplifier.

In an embodiment of the invention, an amplifier power usage of said audio amplifier is measured and said power conversion settings are based on said amplifier power usage.

If the actual power usage of the audio amplifier is measured, e.g., by sensing current and/or voltage provided to the audio amplifier, it is possible to improve the prediction of the selection of power conversion settings. Selecting power conversion settings may for example be based on prediction coefficients incorporated in a voltage transfer function or a current transfer function. Such prediction coefficients may be updated, e.g., regularly, based on a measured amplifier power usage to optimize precision and accuracy, which is advantageous.

In some embodiments of the invention, the power conversion settings may indirectly be based on amplifier power usage. For example, calculating the power demand estimate may be based on the measured amplifier power usage, and the power conversion settings are based on the power demand estimate.

In an embodiment of the invention, said DC to DC converter is a step-up converter.

A step-up converter may be understood as a DC to DC converter which yields an output voltage which is greater than its input voltage/source voltage, i.e. its DC input voltage is lower than its output voltage. Correspondingly, the current of the output is smaller than the current of the input.

Using a step-up converter is advantageous, since in many applications, voltage requirements are large compared to the voltage of a power source without a step-up converter, such as a USB connection.

In an embodiment of the invention, said DC to DC converter is a switch-mode boost converter.

Using a switch-mode boost converter is advantageous because a switch-mode boost converter is simple, efficient, and controllable. It may typically comprise at least one transistor which is regularly switched, a diode, and an inductor. It may also comprise a capacitor, e.g., for storing energy. It may further comprise one or more filters, e.g., input/output filters, to reduce noise.

In an embodiment of the invention, said DC to DC converter is associated with a proportional-integral-derivative (PID) controller.

For example, a switch-mode boost converter may be connected to and, at least partially, controlled by a PID controller, which ensures a stable power/voltage/current output of the switch-mode boost converter.

In some embodiments, the PID controller is integrated in the DC to DC converter.

Stabilizing the output of the DC to DC converter is advantageous, since it ensures proper audio amplification.

In an embodiment of the invention, said audio signal processor is a digital signal processor.

Using a digital signal processor is advantageous, since it enables an easier adaptation of the method of the invention. A digital signal processor may typically have integrated analogue-to-digital converters and digital-to-analog converters. The input audio signal may for example be supplied to a digital signal processor through an analog-to-digital converter before the input audio signal is processed. Similarly, the delayed audio signal may be supplied to a digital-to-analog converter before it is supplied to the audio amplifier.

In an embodiment of the invention, said power input is supplied by a battery.

In an embodiment of the invention, said power input is supplied by a USB connection.

In an embodiment of the invention, said power input is supplied by an ethernet connection.

USB connections, ethernet connections and current-limited batteries are examples of power sources which are particularly relevant for the invention, since the available current is limited. Additionally, the power limits can be adapted to match the state or quality of the power source, for example if a battery is in a low state of charge the internal resistance can increase, and therefore power output may be more limited than when it is at a higher state of change. For example, USB or ethernet power sources have a power negotiation protocol that restrict power to different levels depending on the capabilities of the source device.

In an embodiment of the invention, the method of the invention comprises a step of supplying said amplified audio signal to a loudspeaker transducer arranged to reproduce said amplified audio signal as sound pressure waves.

In embodiments of the invention, the audio amplifier system is arranged to carry out any of the disclosed methods of the present invention. Accordingly, the audio amplifier system may comprise any elements necessary for carrying out any of the disclosed methods.

Any audio amplifier system according to the invention may have the same advantages as methods of the invention.

In an embodiment of the invention, said audio amplifier system comprises a loudspeaker transducer such that said audio amplifier system is a loudspeaker system wherein said amplified audio signal is provided to said loudspeaker transducer to reproduce said amplified audio signal as sound pressure waves.

Any loudspeaker system according to the invention may have the same advantages as methods of the invention.

Embodiments of the present invention may comprise various combinations of various processing parameters and system elements, such as analysis operations, delay duration, duration of analysis time window and its timing compared to the delay duration, transfer functions, capacitors, power source, DC to DC converter etc. For various embodiments, such system elements and parameters may for example be selected to adjust an audio amplifier system to a certain use. This selection may for example be performed by a person skilled in the art, for example to ensure a certain level of audio output power, distortion, power consumption, processing power, analysis quality, delay, etc. Thus, implementations of embodiments of the invention may be varied depending on the application of the audio amplifier system.

From the above, it is now clear that the invention relates to a method and a system for powering an audio amplifier. By delaying an input audio signal before supplying it to an audio amplifier, it is possible to analyse the input audio signal to predict a power demand estimate. Based on this estimate, power conversion settings, e.g., output voltage, of a DC to DC converter powering the audio amplifier may be selected. Any surplus output power of the DC to DC converter may be stored in an energy storage. The invention allows optimal operation of the DC to DC converter, and storage of energy, which in turn reduces resistive losses and increases audio output power.

The invention has been exemplified above with the purpose of illustration rather than limitation with reference to specific examples of methods and audio amplifier systems. Details such as a specific method and system structures have been provided to understand embodiments of the invention. Detailed descriptions of well-known systems, devices, circuits, and methods have been omitted so as to not obscure the description of the invention with unnecessary details. It should be understood that the invention is not limited to the particular examples described above and a person skilled in the art can also implement the invention in other embodiments without these specific details. As such, the invention may be designed and altered in a multitude of varieties within the scope of the invention as specified in the claims.

LIST OF REFERENCE SIGNS

1 Audio amplifier
2, 2' Input audio signal
3 Audio signal processor
4 Delayed audio signal, output audio signal
5 Power demand estimate
6 Power conversion settings, power conversion control output
7 DC to DC converter
8 Power input
9 Power output
10 Amplified audio signal
11 Energy storage
12 Auxiliary capacitors
13 Voltage transfer function
14 Current transfer function
15 Dynamic range compression
16 Battery
17 Loudspeaker transducer
18 Audio signal delay operation
19 Dynamic range compression transfer function
20 Audio signal analysis operation
21 Output voltage representation
22 Max output current representation
23 Peak detection analysis
24 Addition operation
25 Amplifier power usage measurement
26 Stored energy
27 Delay duration
28 Equalization filter
29 Audio signal peak structure
30 Audio amplifier system
31 Loudspeaker system
S1-S8 Method steps

The invention claimed is:

1. A method for powering an audio amplifier, comprising:
receiving an input audio signal in an audio signal processor;
delaying said input audio signal in said audio signal processor to generate a delayed audio signal, wherein said delaying said input audio signal comprises delaying said input audio signal by a delay duration;
predicting a power demand estimate by analyzing said input audio signal to calculate said power demand estimate in said audio signal processor, wherein said predicting said power demand estimate comprises analyzing said input audio signal within an analysis time window, and the ratio between the duration of said analysis time window and said delay duration is in the range from 0.1 to 10, as well as said predicting said power demand estimate comprises integrating at least a squared amplitude of said input audio signal in the time domain and/or in the frequency domain within said analysis time window to calculate said power demand estimate;
selecting, by said audio signal processor, power conversion settings for a DC to DC converter on the basis of said power demand estimate;
supplying power input to said DC to DC converter; converting said power input in accordance with said power conversion settings to provide a power output;
powering said audio amplifier using said power output; and supplying said delayed audio signal to said audio amplifier from said audio signal processor to generate an amplified audio signal.

2. The method for powering an audio amplifier according to claim 1, further comprising charging an energy storage using said power output, wherein said energy storage is arranged to store energy of said power output and disperse energy to said audio amplifier, and wherein said powering said audio amplifier comprises using power dispersed by said energy storage.

3. The method for powering an audio amplifier according to claim 2, wherein said energy storage is based on one or more auxiliary capacitors associated with said DC to DC converter.

4. The method for powering an audio amplifier according to claim 1, wherein said delay duration is in the range from 1 millisecond to 100 milliseconds.

5. The method for powering an audio amplifier according to claim 1, wherein said predicting said power demand estimate comprises using an amplitude of said input audio signal to calculate said power demand estimate.

6. The method for powering an audio amplifier according to claim 5, wherein said predicting said power demand estimate comprises using a transducer impedance transfer function to calculate said power demand estimate, and wherein said transducer impedance transfer function is indicative of an impedance of a loudspeaker transducer receiving said amplified audio signal.

7. The method for powering an audio amplifier according to claim 6, wherein said predicting said power demand estimate comprises calculating said power demand estimate by the formula PDE=∫TITF×IAS2dx wherein PDE is said power demand estimate, TITF is said transducer impedance transfer function, IAS is said input audio signal, and the integration is performed based on said input audio signal within said analysis time window.

8. The method for powering an audio amplifier according to claim 1, wherein said selecting said power conversion settings comprises selecting an output voltage of said power output using a voltage transfer function, and wherein said voltage transfer function is based on said power demand estimate.

9. The method for powering an audio amplifier according to claim 8, wherein said voltage transfer function is based on a voltage look-up table.

10. The method for powering an audio amplifier according to claim 1, wherein said selecting said output voltage is based on a peak amplitude of said input audio signal.

11. The method for powering an audio amplifier according to claim 1, wherein said selecting said power conversion settings comprises selecting a max output current of said power output using a current transfer function, and wherein said current transfer function is based on said power demand estimate.

12. The method for powering an audio amplifier according to claim 11, wherein said current transfer function is based on a current look-up table.

13. The method for powering an audio amplifier according to claim 1, further comprising applying dynamic range compression to any of said input audio signal and said delayed audio signal in said audio signal processor, wherein said dynamic range compression is based on said power demand estimate.

14. The method for powering an audio amplifier according to claim 1, further comprising measuring an amplifier power usage of said audio amplifier, wherein said power conversion settings are based on said amplifier power usage.

15. The method for powering an audio amplifier according to claim 1, wherein said DC to DC converter is a switch-mode boost converter.

16. An audio amplifier system, comprising:
an audio signal processor arranged to receive an input audio signal and supply an output audio signal based on said input audio signal;
a DC to DC converter powered by a power input and arranged to convert said power input to provide a power output; and an audio amplifier powered by said power output and arranged to amplify said output audio signal to generate an amplified audio signal;
wherein said audio signal processor comprises: an audio signal delay operation arranged to generate said output audio signal by delaying said input audio signal, by a delay duration; and an audio signal analysis operation arranged to calculate a power demand estimate based on amplitude of said input audio signal to output a power conversion control output based on said power demand estimate, wherein said calculating said power demand estimate comprises analyzing said input audio signal within an analysis time window, and the ratio between the duration of said analysis time window and said delay duration is in the range from 0.1 to 10, as well as said calculating said power demand estimate comprises integrating at least a squared said amplitude of said input audio signal in the time domain and/or in the frequency domain within said analysis time window to calculate said power demand estimate, and wherein said DC to DC converter is arranged to receive said power conversion control output and convert said power input according to said power conversion control output to provide said power output.

17. The audio amplifier system according to claim 16, wherein said audio amplifier system is arranged to carry out the method according to claim 1.

18. A loudspeaker system, comprising: a loudspeaker transducer; and the audio amplifier system according to claim 16, wherein said amplified audio signal is provided to said loudspeaker transducer to reproduce said amplified audio signal as sound pressure waves.

* * * * *